(12) United States Patent
Kumar

(10) Patent No.: US 12,410,906 B1
(45) Date of Patent: Sep. 9, 2025

(54) HYBRID LASER AND LED BASED ILLUMINATION DEVICE

(71) Applicant: Luminus, Inc., Sunnyvale, CA (US)

(72) Inventor: Muralidhar Kumar, Pleasanton, CA (US)

(73) Assignee: Luminus, Inc., Sunnyvale, CA (US)

( * ) Notice: Subject to any disclaimer, the term of this patent is extended or adjusted under 35 U.S.C. 154(b) by 0 days.

(21) Appl. No.: 18/658,839

(22) Filed: May 8, 2024

(51) Int. Cl.
| | |
|---|---|
| *F21V 19/00* | (2006.01) |
| *F21V 29/70* | (2015.01) |
| *F21Y 105/16* | (2016.01) |
| *F21Y 113/20* | (2016.01) |
| *F21Y 115/10* | (2016.01) |
| *F21Y 115/30* | (2016.01) |
| *H01L 25/075* | (2006.01) |

(52) U.S. Cl.
CPC ............ *F21V 19/002* (2013.01); *F21V 29/70* (2015.01); *H01L 25/0753* (2013.01); *F21Y 2105/16* (2016.08); *F21Y 2113/20* (2016.08); *F21Y 2115/10* (2016.08); *F21Y 2115/30* (2016.08)

(58) Field of Classification Search
CPC .......................... F21Y 2113/20; H01L 25/0753
See application file for complete search history.

(56) References Cited

U.S. PATENT DOCUMENTS

| | | | | |
|---|---|---|---|---|
| 9,853,413 | B2 * | 12/2017 | Kim | ..................... H01S 5/02253 |
| 10,263,395 | B2 * | 4/2019 | Kim | ........................ H01S 5/423 |
| 2004/0217364 | A1 * | 11/2004 | Tarsa | ................... H01L 25/0753 |
| | | | | 257/89 |
| 2012/0229292 | A1 * | 9/2012 | Laabs | .................... F21V 29/507 |
| | | | | 340/815.45 |
| 2013/0121759 | A1 * | 5/2013 | Breidenassel | ........... F21V 29/50 |
| | | | | 403/330 |
| 2016/0131318 | A1 * | 5/2016 | Kim | ..................... H01S 5/02253 |
| | | | | 362/311.02 |
| 2016/0165680 | A1 * | 6/2016 | Johnson | ................ F21V 23/005 |
| | | | | 438/23 |
| 2018/0159303 | A1 * | 6/2018 | Kim | ........................ F21V 5/043 |
| 2024/0170911 | A1 * | 5/2024 | Templier | ............. H01L 25/0753 |

FOREIGN PATENT DOCUMENTS

| | | | | | |
|---|---|---|---|---|---|
| CN | 102918930 | A | * | 2/2013 | ............. F21S 8/006 |
| KR | 20080062490 | A | * | 7/2008 | |
| WO | WO-2024163722 | A2 | * | 8/2024 | ............. A45F 3/005 |

* cited by examiner

*Primary Examiner* — Alexander K Garlen
(74) *Attorney, Agent, or Firm* — Spano Law Group; Joseph S. Spano

(57) ABSTRACT

Methods and systems for combining electrically isolated LEDs and one or more laser diodes into a hybrid illumination device are presented herein. A hybrid LED and laser diode based illumination device includes both electrically isolated LEDs and one or more laser diodes assembled on common metal core printed circuit board. Employing electrically isolated LEDs allows the electrical connection of multiple LEDs in series on the common metal core printed circuit board with high spatial density. In some embodiments, a laser diode source is located within a spatial envelope of an LED array to realize a particularly compact, high optical power, hybrid LED and laser diode based illumination device with a relatively small illumination source etendue. In a further aspect, different sets of LEDs and one or more laser diodes are independently controlled to generate illumination with different spectral characteristics.

20 Claims, 9 Drawing Sheets

HYBRID LASER AND LED BASED ILLUMINATION DEVICE

TECHNICAL FIELD

The described embodiments relate to illumination device that include a Laser diode based illumination source and a Light Emitting Diode (LED) based illumination source.

BACKGROUND INFORMATION

Light emitting devices employing Light Emitting Diode (LED) or Laser Diode (LD) illumination sources have achieved broad market penetration due to their electrical efficiency, long lifetime, high reliability, relatively low cost of manufacture, and physical scalability. Markets addressed by LED based light emitting devices include vehicle lighting, indoor and outdoor building lighting, display lighting, etc. In particular, LED based light emitting devices are rapidly replacing traditional illumination sources such as incandescent bulbs and fluorescent bulbs in general illumination applications.

In many industrial applications LEDs and LDs are employed at ultraviolet wavelengths to cure different materials, e.g., adhesives, etc. In these applications, relatively high optical power is required to meet throughput requirements of high volume processing equipment, e.g., semiconductor packaging applications. Industrial processing equipment is employed to cure many different process materials, often at different wavelength ranges. Unfortunately, as narrowband emitters, LEDs and LDs are not directly suited to illumination applications that require high power illumination at a number of different spectral bands.

In some examples, one or more different illumination sources are selected to illuminate the workpiece under process as required by the process application. In some examples, the output of each different illumination source is independently controlled, e.g., switched on/off. In some examples, the output of each different illumination source is selectively directed to the workpiece under process or away from the workpiece under process by movement of an optical element of the optics system, e.g., a flip-in mirror, mechanical shutter, etc.

In some examples, several different illumination sources, each emitting at different spectral bands, are employed. However, the etendue of one or more of the different illumination sources do not overlap. Thus, the optical path from one or more of the different illumination sources is not the same as other illumination sources. To overcome this limitation, the optical output of different illumination sources is optically combined using various discrete optical elements, e.g., mirrors, beam splitters, etc., located or selectively located in an optical path specific to a subset of the different illumination sources. In these examples, one or more optical elements do not interact with light output from all of the different illumination sources. This approach increases the cost and complexity of the optical system.

Current process equipment requires separate illumination optics associated with different illumination sources to effectively combine illumination light required to process different materials at different spectral ranges. This approach complicates the optical design of the process equipment, introduces optical losses, and increases equipment cost.

Future process applications present challenges for high throughput curing of different materials at high optical power and different spectral ranges. Thus, methods and systems for improved illumination power and spectral control are desired.

SUMMARY

Methods and systems for combining electrically isolated LEDs and one or more laser diodes into a hybrid illumination device are presented herein. A hybrid LED and laser diode based illumination device includes both electrically isolated LEDs and one or more laser diodes assembled on common metal core printed circuit board. Employing electrically isolated LEDs allows the electrical connection of multiple LEDs in series on the common metal core printed circuit board. This enables the integration of multiple LEDs and one or more laser diodes with high spatial density.

In some embodiments, illumination generated by a hybrid illumination device is directed to an optics subsystem. The etendue of each of the illumination sources of the hybrid illumination device overlap over an area perpendicular to an optical path through the optics subsystem. Furthermore, each of the illumination sources share a common optical path through the optics subsystem from the hybrid illumination device to a workpiece under process. In this manner, the optical output of any combination of the illumination sources of the hybrid illumination device is projected onto the workpiece under process using the same optical elements in the same configuration.

In one aspect, a hybrid LED and laser diode based illumination device includes both electrically isolated LEDs and one or more laser diodes assembled on a common metal core printed circuit board. In preferred embodiments, each of the one or more laser diode illumination sources is also electrically isolated.

Electrically isolated LEDs flow current through top facing terminals rather than the backside surface of the LED die. In some embodiments, multiple bare LED die are mounted to a common MC-PCB and wired in series using wire bonds on top of the LED die. In high optical power applications, it is advantageous to couple multiple bare LED die in series to minimize the current that must be generated by a current driver to drive multiple LED die. Furthermore, it is advantageous to couple multiple bare LED die in series to maximize the spatial density of LED die mounted to a MC-PCB. This minimizes the illumination source etendue and simplifies the optics subsystem required to focus the illumination light on the workpiece.

In some embodiments, a laser diode source is located within a spatial envelope of an LED array to realize a particularly compact, high optical power, hybrid LED and laser diode based illumination device. By locating the laser diode source within the spatial envelope of the LED array, the illumination source etendue of the hybrid LED and laser diode based illumination device may be further reduced compared to a design where the laser diode source is located outside the spatial envelope of the LED array.

In some embodiments, a hybrid LED and laser diode based illumination device includes a multiple layer MC-PCB. In some of these embodiments, the electrical traces electrically coupled to one of more laser diode based illumination sources are patterned from a different electrically conductive metal layer than the electrical traces electrically coupled to one or more LED based illumination sources of the hybrid LED and laser diode based illumination device.

In a further aspect, different sets of LEDs and one or more laser diodes are independently controlled to generate illumination with different spectral characteristics. In this manner, the illumination characteristics of the hybrid LED and laser diode based illumination device are adapted to applications that require different combinations of illumination wavelengths. In some examples, different combinations of illumination sources of the hybrid LED and laser diode based illumination device are employed using the same optical subsystem to perform industrial curing of a wide range of materials.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for combining electrically isolated LEDs and one or more laser diodes into a hybrid illumination device are presented herein. A hybrid LED and laser diode based illumination device includes both electrically isolated LEDs and one or more laser diodes assembled on common metal core printed circuit board. Employing electrically isolated LEDs allows the electrical connection of multiple LEDs in series on the common metal core printed circuit board. This enables the integration of multiple LEDs and one or more laser diodes with high spatial density.

Figure 1:
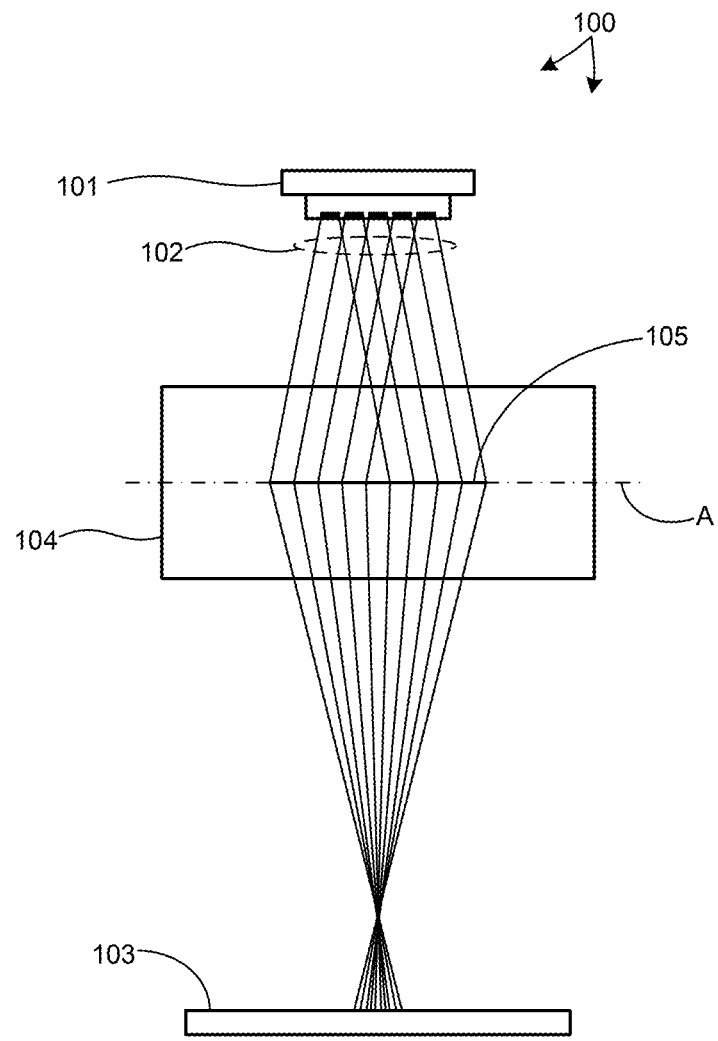
FIG. 1 is a simplified diagram illustrative of an illumination system including a hybrid LED and laser diode based illumination device and an optics subsystem.

FIG. 1 depicts a simplified illustration of an illumination system 100 including a hybrid LED and laser diode based illumination device 101 and an optics subsystem 104. As depicted in FIG. 1, illumination light 102 generated by hybrid LED and laser diode based illumination device 101 is collected by optics subsystem 104 and collimated or focused onto workpiece 103. As depicted in FIG. 1, the etendue of each of the illumination sources of the hybrid illumination device overlap over an area 105 of plane A. Plane A is a plane perpendicular to an optical path through the optics subsystem 104. Furthermore, each of the illumination sources share a common optical path through optics subsystem 104 from the hybrid illumination device 101 to the workpiece 103 under process. In this manner, the optical output of any combination of the illumination sources of the hybrid illumination device is projected onto the workpiece under process using the same optical elements in the same configuration. In this manner, the hybrid illumination device is able to illuminate a workpiece under process, e.g., an industrial curing process, using any combination of illumination sources using the same optical elements, without reconfiguring the optical system. In some examples, optical subsystem 104 includes a single focusing optical element, e.g., a refractive objective. In some other examples, multiple optical elements, e.g. mirrors, may be employed to collect illumination light 102 and collimate or focus illumination light 102 onto workpiece 103.

Figure 2:
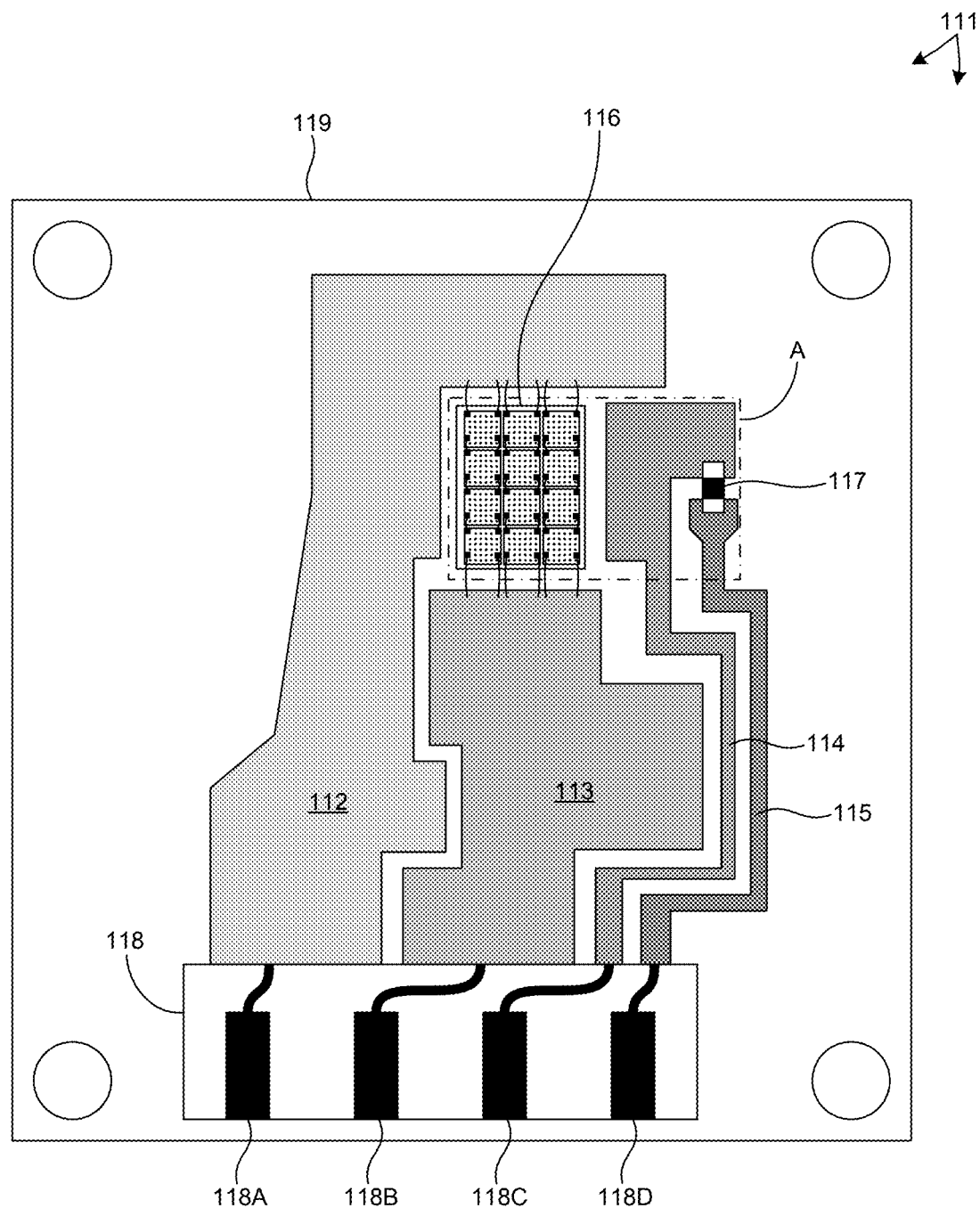
FIG. 2 is a simplified diagram illustrative of a hybrid LED and laser diode based illumination device in one embodiment including an array of electrically isolated LEDS and a laser diode mounted to a metal core printed circuit board (MC-PCB).

In one aspect, a hybrid LED and laser diode based illumination device includes both electrically isolated LEDs and one or more laser diodes assembled on a common metal core printed circuit board. FIG. 2 depicts a simplified illustration of a hybrid LED and laser diode based illumination device 111 including an array 116 of electrically isolated LEDs and a laser diode 117 mounted to a metal core printed circuit board (MC-PCB) 119. In preferred embodiments, each of the one or more laser diode illumination sources is also electrically isolated, i.e., the surface of the laser diode die or package mounted to the MC-PCB is not electrically active.

In general, a MC-PCB includes a thermally conductive metal core layer and at least one patterned, electrically conductive metal layer disposed over one or both sides of the thermally conductive metal core layer. The thermally conductive metal core layer is a relatively thick layer of thermally conductive material, e.g., copper, aluminum, etc. A patterned, electrically conductive metal layer is a relatively thin layer of electrically conductive material or combination of materials, e.g., copper, tin, silver, gold, etc.

In the embodiment depicted in FIG. 2, MC-PCB 119 is a single layer PCB. As depicted in FIG. 2, electrical traces 112-115 are patterned from a single electrically conductive metal layer disposed over a thermally conductive metal core layer. In a single layer MC-PCB, a dielectric layer is disposed between the patterned, electrically conductive metal layer and the thermally conductive metal core layer. The dielectric material is electrically insulative and electrically isolates the patterned, electrically conductive metal layer from the thermally conductive metal core layer.

As depicted in FIG. 2, portions of the electrically conductive metal layer are selectively etched in a specified pattern. In the example depicted in FIG. 2, the etch pattern creates gaps in the electrically conductive metal layer that electrically isolate electrical traces 112-115 from one another. As depicted in FIG. 2, a multi-terminal connector 118 is mounted to MC-PCB 119. Terminal connector 118 includes four terminals 118A-D, electrically coupled to electrical traces 112-115, respectively. In this manner, electrical terminal 118A is electrically coupled to one voltage node of LED array 116, electrical terminal 118B is electrically coupled to another voltage node of LED array 116, electrical terminal 118C is electrically coupled to one voltage node of laser diode 117, and electrical terminal 118D is electrically coupled to another voltage node of laser diode 117.

Figure 3:
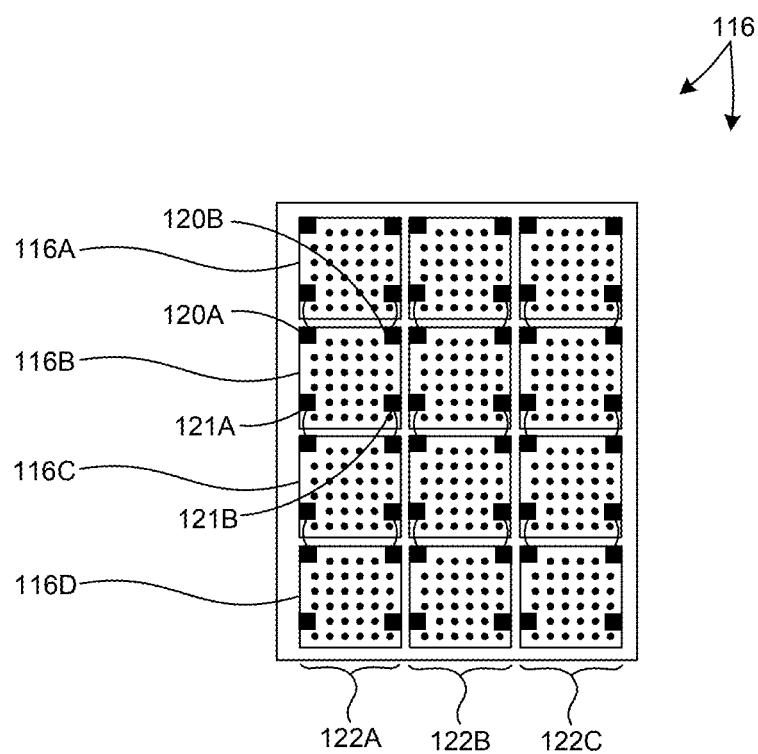
FIG. 3 is a simplified diagram illustrative of an LED array including three sets of electrically isolated, bare LED die, each including four electrically isolated, bare LED die wired in series.

In the embodiment depicted in FIG. 3, LED array 116 includes three sets of electrically isolated, bare LED die 122A-122C, each including four electrically isolated, bare LED die, e.g., bare LED die 116A-D, wired in series. By way of example, bare LED die 116B includes nodes 121A and 121B electrically coupled to the anode of bare LED die 116B and nodes 120A and 120B electrically coupled to the cathode of bare LED die 116B. As depicted in FIG. 3, the cathode of bare LED die 116D is wired to the anode of bare LED die 116C, the cathode of bare LED die 116C is wired to the anode of bare LED die 116B, and the cathode of bare LED die 116B is wired to the anode of bare LED die 116A. Sets 122B and 122C are wired similarly. Furthermore, as depicted in FIG. 2, the anode of bare LED die 116A is wired to electrical trace 113, along with the anode of the corresponding bare LED die of sets 122B and 122C. Similarly, the cathode of LED bare die 116D is wired to electrical trace 112, along with the cathodes of the corresponding bare LED die of sets 122B and 122C. In this manner, the three sets of electrically isolated, bare LED die 122A-122C are electrically coupled in parallel.

In some examples, the sum of the current flow through the three sets of electrically isolated, bare LED die 122A-122C is controlled by a current driver coupled between terminals 118A and 118B. In this manner, the current driver independently controls current flow through LED array 116. Similarly, another current driver (not shown) is electrically coupled across terminals 118C and 118D. This current driver independently controls current flow through laser diode 117. In this manner, light generated by LED array 116 and laser diode 117 is independently controlled by two different current drivers.

Figure 4:
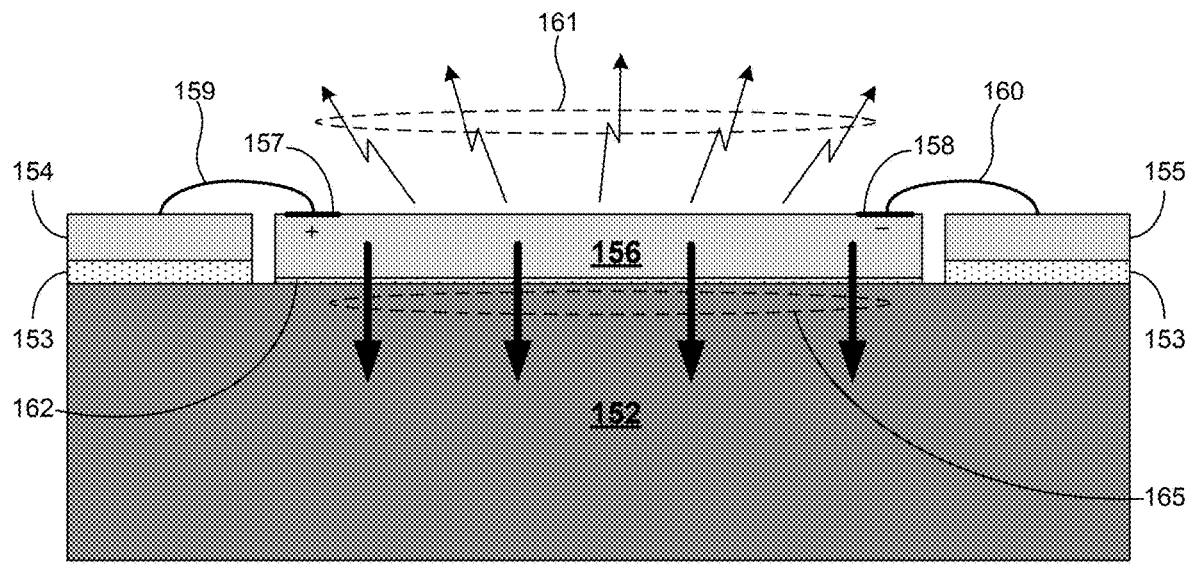
FIG. 4 is a simplified diagram illustrative of a cross-sectional view of an electrically isolated LED based illumination source assembled onto a single layer MC-PCB in a wire bond configuration.

FIG. 4 is a simplified diagram illustrative of a cross-sectional view of an electrically isolated LED based illumination source 156 assembled onto a single layer MC-PCB in a wire bond configuration. As depicted in FIG. 4, the electrically isolated backside of LED based illumination source 156 is disposed over thermally conductive metal core layer 152. As depicted in FIG. 4, heat flow 165 carries thermal energy away from LED based illumination source 156 into thermally conductive metal core layer 152. A thin layer of thermally conductive paste 162 is located between LED based illumination source 156 and thermally conductive metal core layer 152. Thermally conductive paste 162 has high thermal conductivity and fills in any mechanical imperfections between the surfaces of LED based illumination source 156 thermally conductive metal core layer 152 facing one another. This enables a thermal conduction path from the LED based illumination source 156 to the thermally conductive metal core layer 152 with a minimum of thermal resistance. In some examples, the thermally conductive paste 162 includes a matrix of silver particles, gold particles, a mixture of silver and tin particles, etc.

As depicted in FIG. 4, electrical traces 154 and 155 are patterned from a single electrically conductive metal layer disposed over a thermally conductive metal core layer 152. Dielectric layer 153 electrically isolates electrical traces 154 and 155 from thermally conductive metal core layer 152. As depicted in FIG. 4, LED based illumination source 156 includes top facing electrical interconnect pads 157 and 158. Electrical interconnect pad 157 is electrically coupled to electrical trace 154 via wire bond 159. Similarly, electrical interconnect pad 158 is electrically coupled to electrical trace 155 via wire bond 160. Electrical traces 154 and 155 are electrically isolated from one another and an electrical current is driven through LED based illumination source 156 via a voltage difference maintained between electrical traces 154 and 155. The electrical current induces light emission 161 from LED based illumination source 156.

The MC-PCB mechanically and electrically interfaces LED based illumination source 156 with the application environment in which LED based illumination source 156 is installed. The electrically isolated backside surface of LED based illumination source 156 does not participate in the electrical circuit driving current through LED based illumination source 156. Thus, the coupling of the backside surface of LED based illumination source 156 to metal core layer 152 is optimized for thermal performance without consideration of electrical performance. For example, the thermally conductive paste 162 is selected to be as thermally conductive as possible without regard for electrical resistance because no particular electrical isolation or conductivity is required at the interface between the LED based illumination source 156 and the metal core layer 152.

Figure 5:
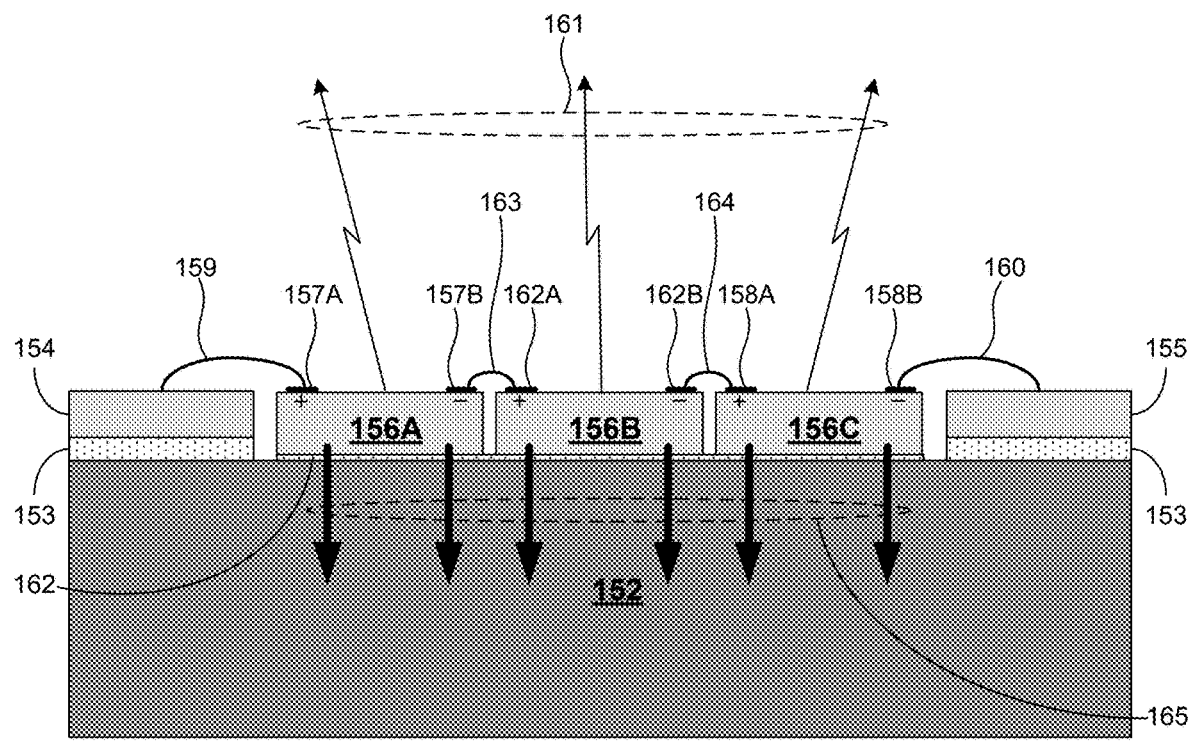
FIG. 5 is a simplified diagram illustrative of a cross-sectional view of multiple electrically isolated LED based illumination sources assembled onto a single layer MC-PCB and electrically coupled in series in a wire bond configuration.

In a similar manner, electrically isolated LED based illumination sources may be electrically coupled in series using wire bonds with high spatial density. FIG. 5 is a simplified diagram illustrative of a cross-sectional view of multiple electrically isolated LED based illumination sources 156A-C assembled onto a single layer MC-PCB and electrically coupled in series in a wire bond configuration. Like numbered elements depicted in FIG. 4 are analogous. As depicted in FIG. 5, LED based illumination sources 156A-C each include top facing electrical interconnect pads electrically coupled to an anode and a cathode, respectively, or each corresponding LED based illumination source.

Electrical interconnect pad 157A of LED based illumination source 156A is electrically coupled to electrical trace 154 via wire bond 159. Electrical interconnect pad 157B of LED based illumination source 156A is electrically coupled to electrical interconnect pad 162A of LED based illumination source 156B via wire bond 163. Electrical interconnect pad 162B of LED based illumination source 156B is electrically coupled to electrical interconnect pad 158A of LED based illumination source 156C via wire bond 164. Electrical interconnect pad 158B of LED based illumination source 156C is electrically coupled to electrical trace 155 via wire bond 160. Electrical traces 154 and 155 are electrically isolated from one another and an electrical current is driven through LED based illumination sources 156A-C via a voltage difference maintained between electrical traces 154 and 155. The electrical current induces light emission 161 from LED based illumination sources 156A-C.

As illustrated in FIG. 5, electrically isolated LEDS flow current through top facing terminals rather than the backside surface of the LED die. As a result, multiple bare LED die may be mounted to a common MC-PCB and wired in series using wire bonds on top of the LED die. In high optical power applications, it is advantageous to couple multiple bare LED die in series to minimize the current that must be generated by a current driver to drive multiple LED die. In one example, each of bare LED die 156A-C has a current rating of four Ampere. When coupled in series, a single current driver rated at four ampere is capable of driving LED die 156A-C. When coupled in parallel, a single current driver rated at twelve Ampere is required to drive LED die 156A-C, or alternatively, three current drivers, each rated at four Ampere is required to drive LED die 156A-C. A single twelve Ampere driver is significantly more expensive and is significantly less electrically efficient compared to a four Ampere driver. Similarly, the use of three different four Ampere drivers is significantly more expensive and complex compared to the use of a single four Ampere driver.

Furthermore, it is advantageous to couple multiple bare LED die in series to maximize the spatial density of LED die mounted to a MC-PCB. This minimizes the illumination source etendue and simplifies the optics subsystem required to focus the illumination light on the workpiece. In other words, it is desirable to mount multiple LED die onto an MC-PCB as close together as possible to minimize the size and complexity of the optics subsystem, e.g., optics subsystem 104 depicted in FIG. 1, required to collect and focus illumination light onto the workpiece under process. When coupled in series, it is straightforward to mount LED die in close proximity. However, when coupled in parallel, an electrical trace must be located between LED die to address the cathode or anode of each LED die. As a result, there are significant limitations to how closely LED die can be mounted to a MC-PCB, when the LED die are coupled in parallel.

Although, FIG. 5 depicts three LED die wired in series, and FIGS. 2, 3, 7, and 10 depict four LED die wired in series, in general, a hybrid LED and laser diode based illumination device may include any integer number of LED die greater than one wired in series.

Figure 6:
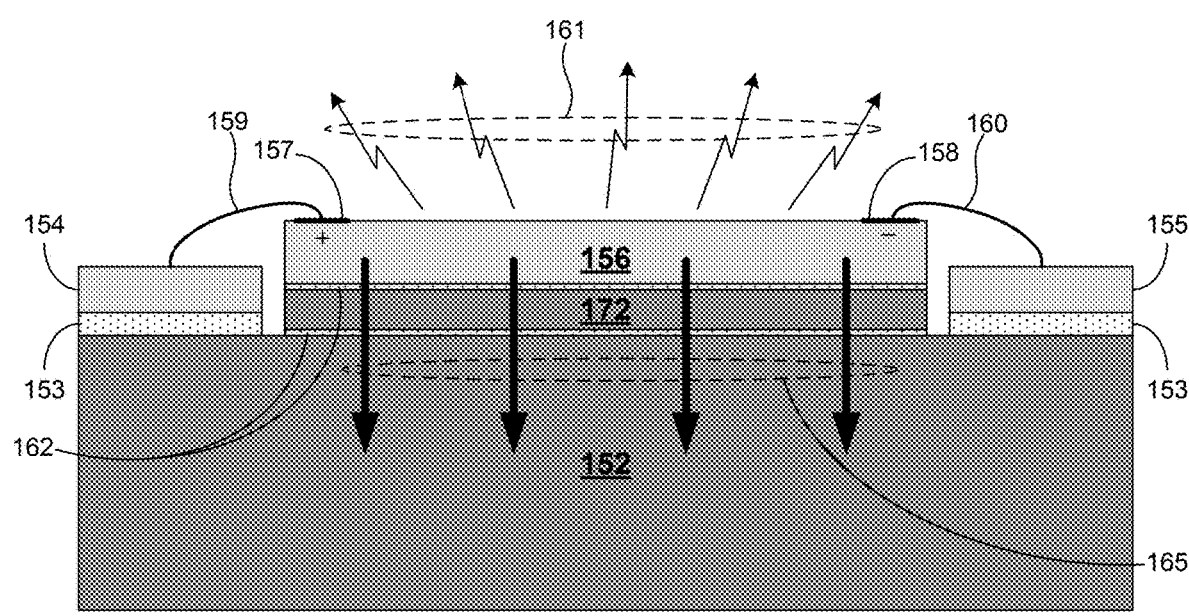
FIG. 6 is a simplified diagram illustrative of a cross-sectional view of an electrically isolated LED based illumination source assembled onto a single layer MC-PCB with a pedestal structure.

FIG. 6 is a simplified diagram illustrative of a cross-sectional view of an electrically isolated LED based illumination source 156 assembled onto a single layer MC-PCB with a pedestal structure 172. Like numbered elements depicted in FIG. 4 are analogous. As depicted in FIG. 6, the electrically isolated backside of LED based illumination source 156 is disposed over thermally conductive metal core layer 152. In addition, a thermally conductive pedestal structure 172 is disposed between LED based illumination source 156 and MC-PCB 152 to adjust the vertical location of LED based illumination source 156 relative to electrical traces 154 and 155. As depicted in FIG. 6, heat flow 165 carries thermal energy away from LED based illumination source 156, through pedestal 172, into thermally conductive metal core layer 152. A thin layer of thermally conductive paste 162 is located between LED based illumination source 156 and pedestal 172 and between pedestal 172 and thermally conductive metal core layer 152. Pedestal structure 172 is fabricated from a thermally conductive material or combination of materials, e.g., copper, tin, silver, gold, etc.

Figure 7:
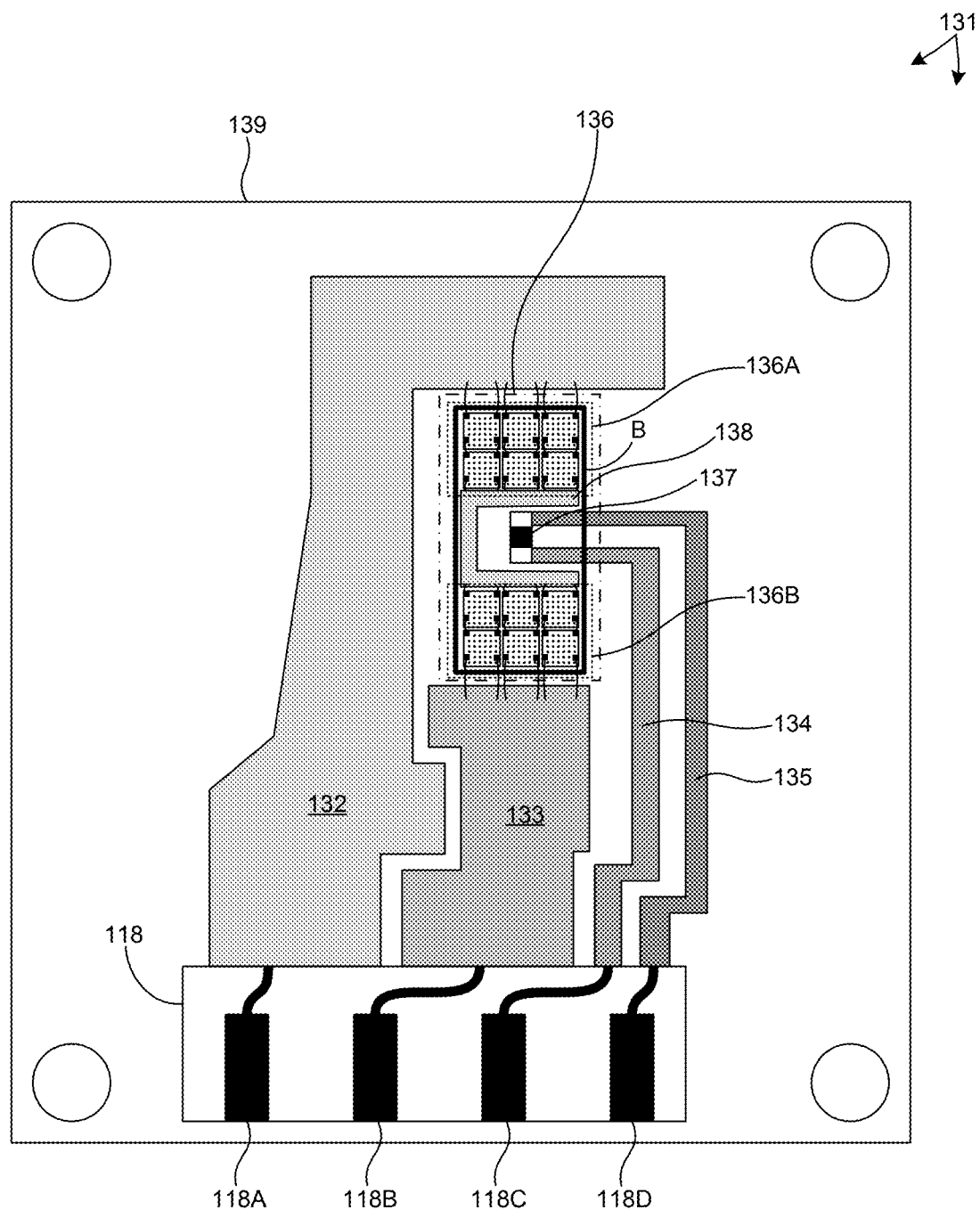
FIG. 7 is a simplified diagram illustrative of a hybrid LED and laser diode based illumination device in another embodiment.

FIG. 7 depicts a simplified illustration of a hybrid LED and laser diode based illumination device 131 including an array 136 of electrically isolated LEDs and a laser diode 137 mounted to a metal core printed circuit board (MC-PCB) 139. Like numbered elements depicted in FIG. 2 are analogous.

As depicted in FIG. 7, electrical traces 132-135 are patterned from a single electrically conductive metal layer disposed over a thermally conductive metal core layer. Terminal connector 118 includes four terminals 118A-D, electrically coupled to electrical traces 132-135, respectively. In this manner, electrical terminal 118A is electrically coupled to one voltage node of LED array 136, electrical terminal 118B is electrically coupled to another voltage node of LED array 136, electrical terminal 118C is electrically coupled to one voltage node of laser diode 137, and electrical terminal 118D is electrically coupled to another voltage node of laser diode 137.

As depicted in FIG. 7, LED array 136 is subdivided into two subarrays of bare LED die 136A and 136B. The two subarrays are electrically coupled in series via electrical trace 138 patterned from the single electrically conductive metal layer of MC-PCB 139. The electrical trace 138 is shaped such that laser diode 137 is located between the two subarrays of bare LED die 136A and 136B. By locating the laser diode source within the spatial envelope B of the LED array 136, a particularly compact, high optical power, hybrid LED and laser diode based illumination device is realized. By locating the laser diode source within the spatial envelope B of the LED array, the illumination source etendue of the hybrid LED and laser diode based illumination device may be further reduced compared to a design where the laser diode source is located outside the spatial envelope of the LED array.

Figure 8:
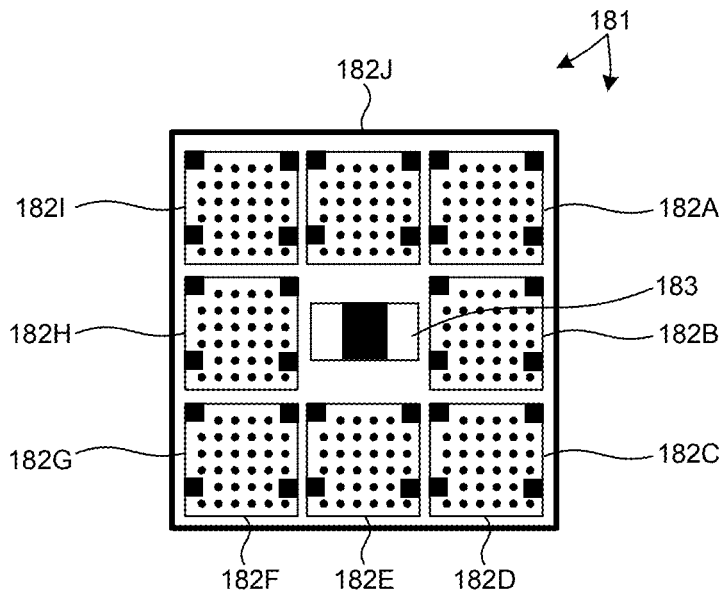
FIG. 8 is a simplified diagram illustrative of a hybrid LED and laser diode based illumination device in another embodiment.

FIG. 8 depicts an illustration of a hybrid LED and laser diode based illumination device 181 in another embodiment. As depicted in FIG. 8, a plurality of electrically isolated LED based illumination sources, e.g., bare LED die, are disposed around one or more electrically isolated laser diode based illumination sources. In particular, FIG. 8 depicts bare LED die 182A-J disposed around laser diode based illumination source 183.

Figure 9:
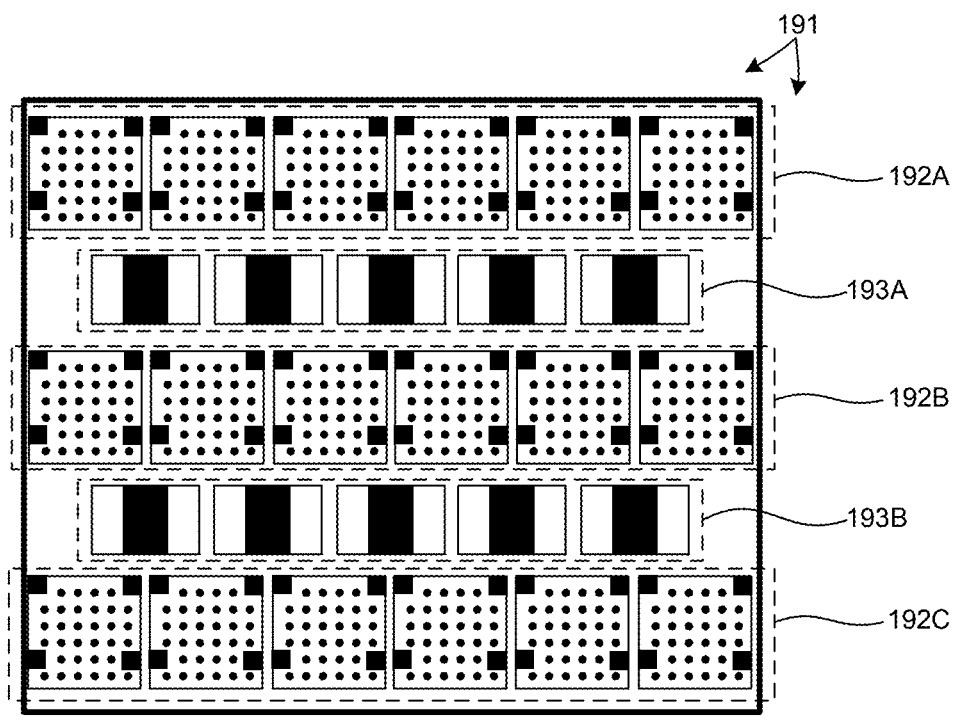
FIG. 9 is a simplified diagram illustrative of a hybrid LED and laser diode based illumination device in another embodiment.

FIG. 9 depicts an illustration of a hybrid LED and laser diode based illumination device 191 in another embodiment. As depicted in FIG. 9, one or more electrically isolated laser diode based illumination sources are disposed in a pattern interspersed among the plurality of electrically isolated LED based illumination sources. In particular, FIG. 9 depicts patterns of laser diode based illumination sources 193A and 193B interspersed among bare LED die 192A-C.

In embodiments employing a multiple layer MC-PCB, multiple electrically conductive metal layers are disposed over a thermally conductive metal core layer in a stacked configuration. In these embodiments, a dielectric layer is disposed between each of the electrically conductive metal layers and the thermally conductive metal core layer in the stack.

In some embodiments, a hybrid LED and laser diode based illumination device includes a multiple layer MC-PCB. In some of these embodiments, the electrical traces electrically coupled to one of more laser diode based illumination sources are patterned from a different electrically conductive metal layer than the electrical traces electrically coupled to one or more LED based illumination sources of the hybrid LED and laser diode based illumination device.

In some embodiments, an LED based illumination source is a group III nitride semiconductor structure, including, by way of non-limiting example, an n layer, a light emitting layer, and a p layer. In various examples, the group III nitride semiconductor structure is AlGaN-based, GaN-based, or InAlGaN-based. In general, a group III nitride semiconductor structure is configured to emit wavelengths in the ultraviolet spectral band, e.g., ultraviolet light in a range between 365 nanometers and 405 nanometers, the visible spectral band, e.g., blue light having wavelength greater than 405 nanometers, or both.

In some embodiments, an LED based illumination source of a hybrid LED and laser diode based illumination device is a packaged LED illumination source.

In some other embodiments, an LED based illumination source of a hybrid LED and laser diode based illumination device is a bare LED die. In some of these embodiments, each of the LED based illumination sources of a hybrid LED and laser diode based illumination device are bare LED die.

An emission area of each of the plurality of LED based illumination sources of a hybrid LED and laser diode based illumination device is characterized by a length dimension and a width dimension orthogonal to the length dimension. In some embodiments, the length and width dimension of an LED based illumination source of a hybrid LED and laser diode based illumination device is less than 1.5 millimeters by 1.5 millimeters. In some embodiments, the length and width dimension of each LED based illumination source of a hybrid LED and laser diode based illumination device is less than 50 micrometers by 50 micrometers.

In some embodiments, the one or more laser diode based illumination sources of a hybrid LED and laser diode based illumination device are packaged devices. In some of these embodiments, the packages are surface mounted, e.g., a ceramic laser package, a surface mount TO package, etc. In some other embodiments, a laser diode based illumination source of a hybrid LED and laser diode based illumination device is a bare laser diode die. In preferred embodiments, the one or more laser diode based illumination sources are electrically isolated. However, in some embodiments, one or more laser diode based illumination sources are not electrically isolated. In these embodiments, thermally conductive metal core layer of the metal core printed circuit board (MC-PCB) is part of the electrical circuit driving current through the one or more laser diode devices, e.g., the thermally conductive metal core layer is a ground plane in an electrical circuit including the one or more laser diode devices.

In some embodiments, one or more LED based illumination sources of a hybrid LED and laser diode based illumination device emits light at a different peak wavelength than other LED based illumination sources of the hybrid LED and laser diode based illumination device.

In some embodiments, one or more LED based illumination sources of a hybrid LED and laser diode based illumination device emits light at a different peak wavelength than one or more laser diode based illumination sources of the hybrid LED and laser diode based illumination device.

In some examples, different LED based illumination sources of a hybrid LED and laser diode based illumination device emits light with a peak wavelength of 385 nanometers, 365 nanometers, 940 nanometers, or any other suitable peak wavelength. In some of these examples, a LED based illumination source of a hybrid LED and laser diode based illumination device emits light with a peak wavelength in the infrared portion of the electromagnetic spectrum.

In some examples, a laser diode based illumination source of a hybrid LED and laser diode based illumination device emits light with a peak wavelength of 405 nanometers. In some other examples, a laser diode based illumination source of a hybrid LED and laser diode based illumination device emits light in the infrared spectral range, e.g., 940 nanometers, to initiate thermal curing of various materials. However, in general, a laser diode based illumination source of a hybrid LED and laser diode based illumination device may be configured to emit light at any suitable peak wavelength.

In one example, a hybrid LED and laser diode based illumination device includes LED based illumination sources emitting at a peak wavelength at or between 365 nanometers and 385 nanometers and a laser diode based illumination source emitting at a peak wavelength of 405 nanometers. This exemplary hybrid LED and laser diode based illumination device is capable of curing solder mask inks employed in many different applications, e.g., cell phone components, automotive components, etc. For example, such a hybrid LED and laser diode based illumination device may be employed to cure white solder mask ink, which cures at 405 and 415 nanometers, green solder mask ink, which cures as 365 nanometers and 385 nanometers, and black solder mask ink, which cures at 405 nanometers.

In some embodiments, both LED based illumination sources and laser diode based illumination sources of a hybrid LED and laser diode based illumination device are operated simultaneously. As a result the illumination output of the hybrid LED and laser diode based illumination device includes multiple wavelengths. In one example, a current driver coupled to terminals 118A and 118B depicted in FIG. 2 supplies current to LED array 116 at the same time another current driver coupled to terminals 118C and 118D supplies current to laser diode illumination source 117.

However, in some other embodiments, the LED based illumination sources and laser diode based illumination sources of a hybrid LED and laser diode based illumination device are operated separately. For example, it is known that some types of green ink are optimally cured at peak wavelengths of 365 nanometers and 385 nanometers, but are damaged by wavelengths at 405 nanometers. In this example, it is desirable to illuminate the green ink with the illumination output of the LED based illumination sources and not the laser diode based illumination source.

In a further aspect, different sets of LEDs and one or more laser diodes are elements of different electrical circuits that are independently controlled to generate illumination with different spectral characteristics. In this manner, the illumination characteristics of the hybrid LED and laser diode based illumination device are adapted to applications that require different combinations of illumination wavelengths. In some examples, different combinations of illumination sources of the hybrid LED and laser diode based illumination device are employed using the same optical subsystem to perform industrial curing of a wide range of materials. In some embodiments, LEDs and LDs are employed at ultraviolet wavelengths at relatively high optical power to cure different materials, e.g., adhesives, etc.

Figure 10:
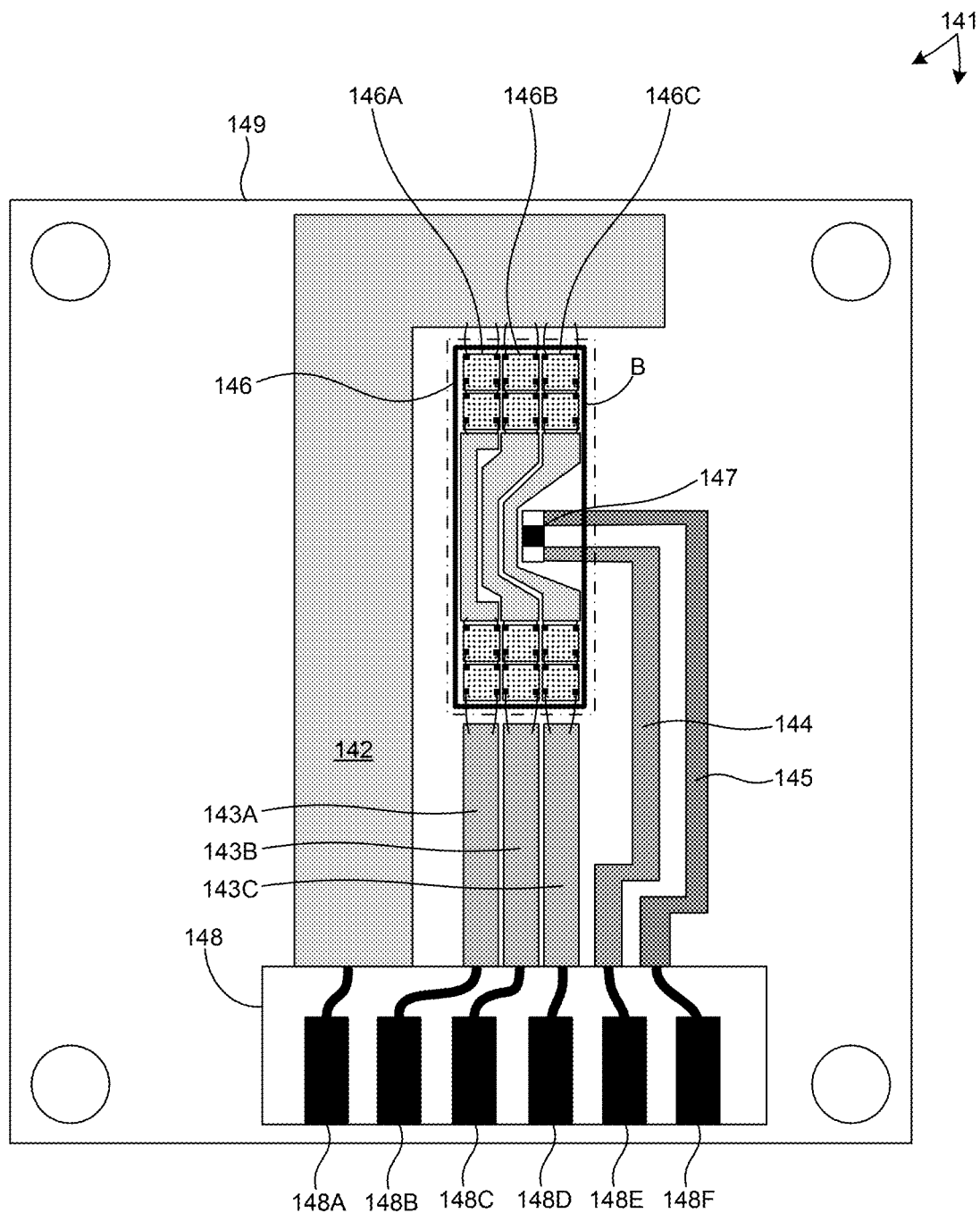
FIG. 10 is a simplified diagram illustrative of a hybrid LED and laser diode based illumination device in another embodiment.

FIG. 10 depicts a simplified illustration of a hybrid LED and laser diode based illumination device 141 including an array 146 of electrically isolated LEDs and a laser diode 147 mounted to a metal core printed circuit board (MC-PCB) 149. Like numbered elements depicted in FIGS. 2 and 7 are analogous.

As depicted in FIG. 10, LED array 146 includes three different LED sub-arrays 146A-C. Electrical traces 142, 143A-C, 144, and 145, are patterned from one or more electrically conductive metal layers disposed over a thermally conductive metal core layer. Terminal connector 148 includes six terminals 148A-F, electrically coupled to electrical traces 142, 143A-C, 144, and 145, respectively. In this manner, electrical terminal 148A is electrically coupled to a voltage node of the LED sub-arrays 146A-C, electrical terminals 148B-D are electrically coupled to the opposite voltage nodes of LED sub-arrays 146A-C, respectively, electrical terminal 148E is electrically coupled to a voltage node of laser diode 147, and electrical terminal 148F is electrically coupled to the opposite voltage node of laser diode 147.

As depicted in FIG. 10, LED array 146 is subdivided into three subarrays 146A-C of bare LED die. Each of the three sub-arrays are elements of different electrical circuits. In the embodiment depicted in FIG. 10, one voltage node of the three subarrays share a common ground terminal, i.e., terminal 148A, but the opposite voltage node of each of the three subarrays is electrically coupled to three different current drivers. In this embodiment, one current driver is electrically coupled between terminals 148A and 148B, a second current driver is electrically coupled between terminals 148A and 148C, and a third current driver is electrically coupled between terminals 148A and 148D. In addition, a fourth current driver is electrically coupled between terminals 148E and 148F.

Each different current driver is independently controlled, and thus the current flow through each of LED sub-arrays 146A-C and laser diode 147 is independently controlled. Each different current driver addresses an independent illumination "channel". The embodiment depicted in FIG. 10 includes four independent illumination channels. However, in general, a hybrid LED and laser diode based illumination device may include any number of independent channels. In general, an independent channel includes one illumination source or multiple illumination sources in series, or multiple illumination sources coupled in series and parallel.

In some embodiments, the peak wavelength of at least one illumination channel is different. In some embodiments, the peak wavelength of each illumination channel is different. In many embodiments, a channel includes 3-6 bare LED die are electrically coupled in series.

Figure 11:
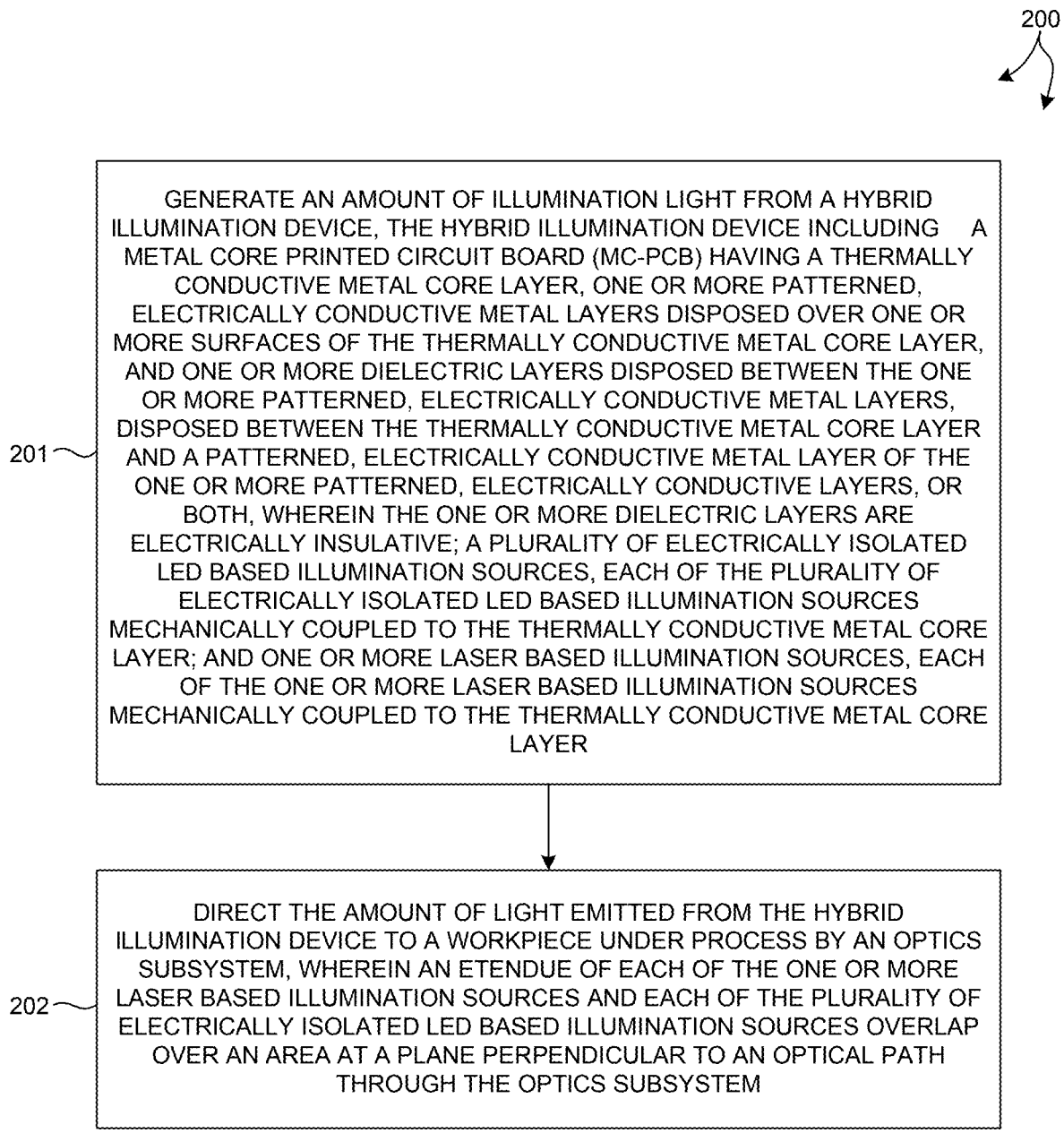
FIG. 11 is a flowchart illustrative of a method for generating illumination light from a hybrid LED and laser diode based illumination device of the present invention.

FIG. 11 illustrates a method 200 suitable for implementation by a hybrid LED and laser diode based illumination device of the present invention. While the following description is presented in the context of hybrid LED and laser diode based illumination devices 111, 131, 141, 181, and 191, it is recognized herein that the particular structural aspects of hybrid LED and laser diode based illumination devices 111, 131, 141, 181, and 191 do not represent limitations and should be interpreted as illustrative only.

In block 201, an amount of illumination light is generated from a hybrid illumination source. The hybrid illumination source includes a metal core printed circuit board (MC-PCB) having a thermally conductive metal core layer, one or more patterned, electrically conductive metal layers disposed over one or more surfaces of the thermally conductive metal core layer, and one or more dielectric layers disposed between the one or more patterned, electrically conductive metal layers, disposed between the thermally conductive metal core layer and a patterned, electrically conductive metal layer of the one or more patterned, electrically conductive layers, or both. The one or more dielectric layers are electrically insulative. The hybrid illumination source also includes a plurality of electrically isolated LED based illumination sources. Each of the plurality of electrically isolated LED based illumination sources is mechanically coupled to the thermally conductive metal core layer. The hybrid illumination source also includes one or more laser diode based illumination sources. Each of the one or more laser diode based illumination sources is mechanically coupled to the thermally conductive metal core layer.

In block 202, the amount of light emitted from the hybrid illumination source is directed to a workpiece under process by an optics subsystem. An etendue of each of the one or more laser diode based illumination sources and each of the plurality of electrically isolated LED based illumination sources overlap over an area at a plane perpendicular to an optical path through the optics subsystem.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A hybrid illumination device comprising:
   a metal core printed circuit board (MC-PCB) having a thermally conductive metal core layer, one or more patterned, electrically conductive metal layers disposed over the thermally conductive metal core layer, and one or more dielectric layers disposed between the one or more patterned, electrically conductive metal layers, disposed between the thermally conductive metal core layer and a patterned, electrically conductive metal layer of the one or more patterned, electrically conductive layers, or both, wherein the one or more dielectric layers are electrically insulative;
   a plurality of electrically isolated LED based illumination sources, each of the plurality of electrically isolated LED based illumination sources having a surface area disposed over the thermally conductive metal core layer, wherein an amount of heat generated by each of the plurality of electrically isolated LED based illumination sources flows through the surface area to the thermally conductive metal core layer, wherein the surface area is not electrically active, wherein at least one of the plurality of electrically isolated LED based illumination sources is electrically coupled to a first of the one or more patterned, electrically conductive metal layers; and
   one or more laser diode based illumination sources, each of the plurality of laser diode based illumination sources disposed over the thermally conductive metal core layer, wherein at least one of the one or more laser diode based illumination sources is electrically coupled to the first of the one or more patterned, electrically conductive metal layers or a second of the one or more patterned, electrically conductive metal layers.

2. The hybrid illumination source of claim 1, wherein the plurality of electrically isolated LED based illumination sources are disposed around the one or more laser diode based illumination sources.

3. The hybrid illumination source of claim 1, wherein the one or more laser diode based illumination sources are disposed in a pattern interspersed among the plurality of electrically isolated LED based illumination sources.

4. The hybrid illumination source of claim 1, wherein the one or more laser diode based illumination sources are electrically isolated.

5. The hybrid illumination source of claim 1, wherein each of the plurality of LED based illumination sources are bare die.

6. The hybrid illumination source of claim 1, wherein an emission area of each of the plurality of LED based illumination sources is characterized by a length dimension and a width dimension orthogonal to the length dimension, and wherein the length dimension and the width dimension are less than 50 micrometers.

7. The hybrid illumination source of claim 1, wherein a first of the plurality of electrically isolated LED based illumination sources is electrically coupled to a first conductive trace of a first of the one or more patterned, electrically conductive metal layers, wherein a second of the plurality of electrically isolated LED based illumination sources is electrically coupled to a second conductive trace of the first patterned, electrically conductive metal layer, wherein the first and second electrically isolated LED based illumination sources are electrically coupled in series, and wherein the first and second conductive traces are electrically isolated from one another.

8. The hybrid illumination source of claim 7, wherein a first of the one or more laser diode based illumination sources is electrically coupled to a first conductive trace of the second of the one or more patterned, electrically conductive metal layers or a third conductive trace of the first of the one or more patterned, electrically conductive metal layers.

9. The hybrid illumination source of claim 7, wherein a third of the plurality of electrically isolated LED based illumination sources is electrically coupled to a third conductive trace of the first patterned, electrically conductive metal layer, wherein a fourth of the plurality of electrically isolated LED based illumination sources is electrically coupled to the second conductive trace or a fourth conductive trace of the first patterned, electrically conductive metal layer, wherein the third and fourth electrically isolated LED based illumination sources are electrically coupled in series, and wherein the third and conductive trace is electrically isolated from the second conductive trace.

10. The hybrid illumination source of claim 9, wherein a peak wavelength of light emitted from the first and second electrically isolated LED based illumination sources is different from a peak wavelength of light emitted from the third and fourth electrically isolated LED based illumination sources.

11. The hybrid illumination source of claim 10, wherein a current flow through the first and second electrically isolated LED based illumination sources is controlled independently from a current flow through the third and fourth electrically isolated LED based illumination sources.

12. The hybrid illumination source of claim 8, wherein a peak wavelength of light emitted from the first and second electrically isolated LED based illumination sources is different from a peak wavelength of light emitted from the first of the one or more laser diode based illumination sources.

13. The hybrid illumination source of claim 12, wherein a current flow through the first and second electrically isolated LED based illumination sources is controlled independently from a current flow through the first of the one or more laser diode based illumination sources.

14. A hybrid illumination system comprising:
a hybrid illumination source comprising:
a metal core printed circuit board (MC-PCB) having a thermally conductive metal core layer, one or more patterned, electrically conductive metal layers disposed over one or more surfaces of the thermally conductive metal core layer, and one or more dielectric layers disposed between the one or more patterned, electrically conductive metal layers, disposed between the thermally conductive metal core layer and a patterned, electrically conductive metal layer of the one or more patterned, electrically conductive layers, or both, wherein the one or more dielectric layers are electrically insulative;
a plurality of electrically isolated LED based illumination sources, each of the plurality of electrically isolated LED based illumination sources mechanically coupled to the thermally conductive metal core layer; and
one or more laser diode based illumination sources, each of the plurality of laser diode based illumination sources mechanically coupled to the thermally conductive metal core layer; and
an optics subsystem configured to direct light emitted from the hybrid illumination source to a workpiece under process, wherein an etendue of each of the one or more laser diode based illumination sources and each of the plurality of electrically isolated LED based illumination sources overlap over an area at a plane perpendicular to an optical path through the optics subsystem.

15. The hybrid illumination system of claim 14, wherein a first set of the plurality of electrically isolated LED based illumination sources are electrically coupled in series, wherein a second set of the plurality of electrically isolated LED based illumination sources are electrically coupled in series, and wherein the first set, the second set and the laser diode based illumination source are elements of independent electrical circuits.

16. The hybrid illumination system of claim 15, wherein a peak wavelength of light emitted from the first set of electrically isolated LED based illumination sources is different from a peak wavelength of light emitted from the one or more laser diode based illumination sources, and wherein a current flow through the first set of electrically isolated LED based illumination sources is controlled independently from a current flow through the one or more laser diode based illumination sources.

17. The hybrid illumination system of claim 15, wherein a peak wavelength of light emitted from the first set of electrically isolated LED based illumination sources is different from a peak wavelength of light emitted from the second set of electrically isolated LED based illumination sources, and wherein a current flow through the first set of electrically isolated LED based illumination sources is controlled independently from a current flow through the second set of electrically isolated LED based illumination sources.

18. A method comprising:
generating an amount of illumination light from a hybrid illumination source, the hybrid illumination source including a metal core printed circuit board (MC-PCB) having a thermally conductive metal core layer, one or more patterned, electrically conductive metal layers disposed over one or more surfaces of the thermally conductive metal core layer, and one or more dielectric layers disposed between the one or more patterned, electrically conductive metal layers, disposed between the thermally conductive metal core layer and a patterned, electrically conductive metal layer of the one or more patterned, electrically conductive layers, or both, wherein the one or more dielectric layers are electrically insulative; a plurality of electrically isolated LED based illumination sources, each of the plurality of electrically isolated LED based illumination sources mechanically coupled to the thermally conductive metal core layer; and one or more laser diode based illumination sources, each of the one or more laser diode based illumination sources mechanically coupled to the thermally conductive metal core layer; and
directing the amount of light emitted from the hybrid illumination source to a workpiece under process by an optics subsystem, wherein an etendue of each of the one or more laser diode based illumination sources and each of the plurality of electrically isolated LED based illumination sources overlap over an area at a plane perpendicular to an optical path through the optics subsystem.

19. The method of claim 18, wherein a set of the plurality of electrically isolated LED based illumination sources are electrically coupled in series, and wherein the first set and the one or more laser diode based illumination sources are elements of independent electrical circuits.

20. The method of claim 19, wherein a peak wavelength of light emitted from the set of electrically isolated LED based illumination sources is different from a peak wavelength of light emitted from the one or more laser diode based illumination sources, and wherein a current flow through the set of electrically isolated LED based illumination sources is controlled independently from a current flow through the one or more laser diode based illumination sources.

\* \* \* \* \*